United States Patent
Kim

(10) Patent No.: US 7,983,079 B2
(45) Date of Patent: Jul. 19, 2011

(54) NONVOLATILE SEMICONDUCTOR MEMORY DEVICE AND PROGRAMMING METHOD THEREOF

(75) Inventor: Moo-Sung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 12/216,591

(22) Filed: Jul. 8, 2008

(65) Prior Publication Data

US 2009/0016104 A1    Jan. 15, 2009

(30) Foreign Application Priority Data

Jul. 9, 2007  (KR) ........................ 10-2007-0068683

(51) Int. Cl.
*G11C 16/04* (2006.01)
(52) U.S. Cl. .......... 365/185.03; 365/185.19; 365/185.22
(58) Field of Classification Search ............... 365/185.3, 365/185.17, 185.18, 185.03, 185.2, 185.25, 365/185.09, 185.19
See application file for complete search history.

(56) References Cited

U.S. PATENT DOCUMENTS

| 6,671,207 B1* | 12/2003 | Parker ....................... 365/185.22 |
| 6,714,448 B2 | 3/2004 | Manea |
| 7,177,199 B2 | 2/2007 | Chen et al. |
| 2006/0114725 A1* | 6/2006 | Jeong et al. .............. 365/185.29 |
| 2006/0126399 A1 | 6/2006 | Cho et al. |
| 2007/0074194 A1* | 3/2007 | Hahn et al. .................... 717/150 |
| 2008/0056007 A1* | 3/2008 | Kang et al. .............. 365/185.22 |
| 2008/0123411 A1* | 5/2008 | Crippa et al. ............. 365/185.03 |

FOREIGN PATENT DOCUMENTS

KR  10-2006-0066958 A   6/2006
KR  10-2006-0115996 A   11/2006

* cited by examiner

*Primary Examiner* — VanThu Nguyen
*Assistant Examiner* — Hien N Nguyen
(74) *Attorney, Agent, or Firm* — Lee & Morse, P.C.

(57) ABSTRACT

Provided is a program method of a multi-bit flash memory device. The program method includes correspondingly programming multi-bit data into selected memory cells through pluralities of programming loops. In each programming loop, an increment of a programming voltage applied to the selected memory cells is variable in accordance with a result of program-verification to each of data states with the multi-bit data and the program-verification for the data state corresponding to program-pass is skipped if the result of the program-verification to the data state is passed.

18 Claims, 6 Drawing Sheets

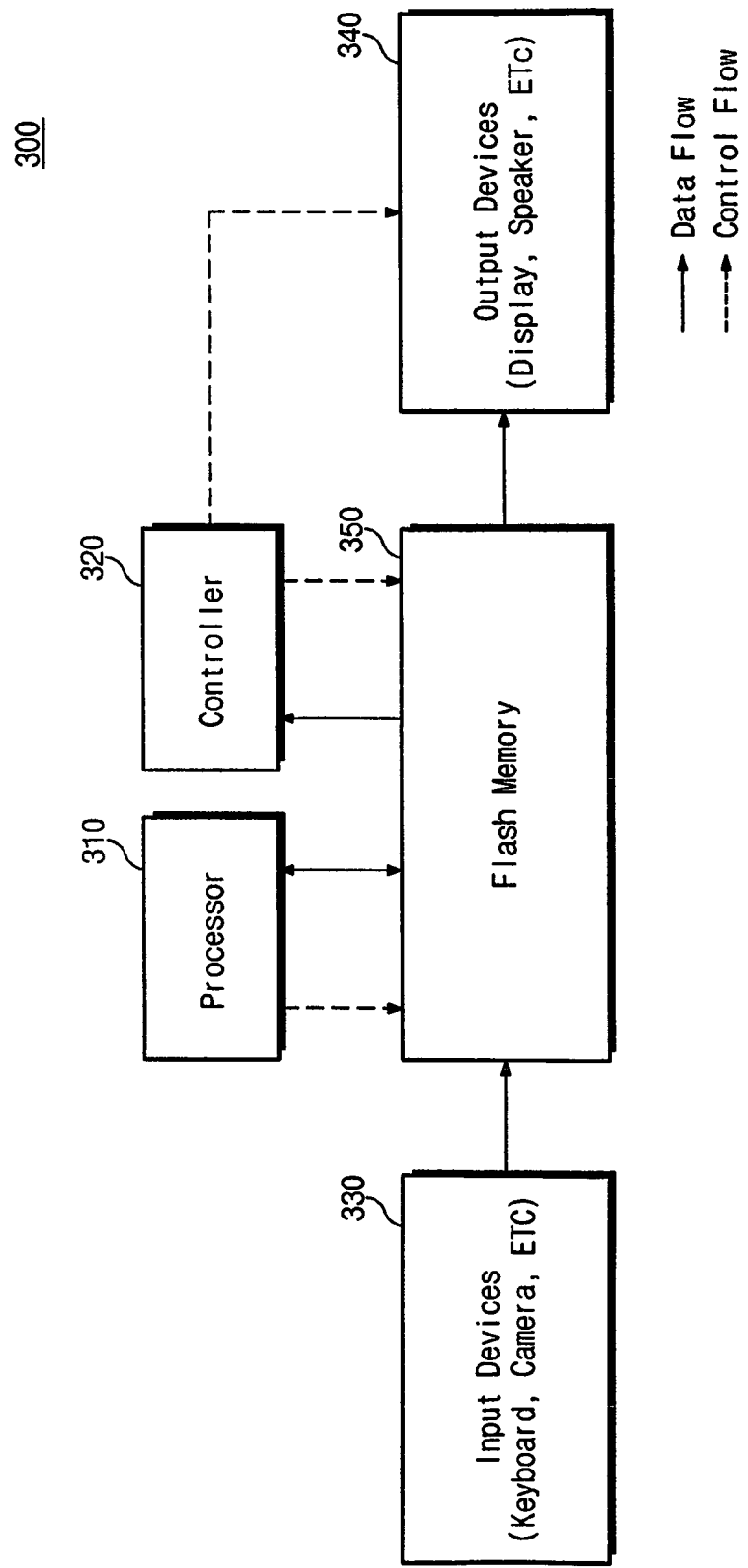

NONVOLATILE SEMICONDUCTOR MEMORY DEVICE AND PROGRAMMING METHOD THEREOF

BACKGROUND OF THE INVENTION

1. Field of the Invention

Embodiments relate to semiconductor memory devices. More particularly, embodiments relate to a programming method for a nonvolatile semiconductor memory device.

2. Description of the Related Art

Semiconductor memory devices may be classified into random access memories (RAMs) and read-only memories (ROMs). ROMs retain data even without power. There are various types of ROMs, e.g., programmable ROMs, erasable and programmable ROMs, electrically programmable and erasable ROMs, flash memories, and so on. Flash memories may be further differentiated in NOR and NAND types. NAND-type flash memory devices are now widely employed in memory cards capable of storing large-quantities of data, because they allow higher integration density than NOR-type flash memory devices.

For the purpose of extending data storage capacity of flash memory devices, many memory cell architectures capable of storing multiple bits have been examined. A memory cell able to store multiple bits is called a 'multi-level cell' (MLC). A memory cell only able to store one bit is called a 'single-level cell' (SLC). Since MLCs each store m-bit data (m is an integer equal to or greater than 2), threshold voltage distributions for MLCs should be more precisely controlled than for SLCs.

In a MLC flash memory device, an incremental step pulse programming (ISPP) scheme is used for precisely controlling the threshold-voltage distributions. According to the ISPP scheme, threshold voltages of the memory cells increase in proportion to a voltage increment of a programming voltage. Thus, by repeating programming loops, the programming voltage applied to a word line increases stepwise to elevate the threshold voltages of the memory cells.

Each programming loop includes of a programming period and a program-verifying period. The programming voltage increases by a predetermined voltage increment ($\Delta V$) by the repetition of the programming loop. The threshold voltage of the memory cell being programmed increases in proportion to the voltage increment ($\Delta V$).

SUMMARY OF THE INVENTION

Embodiments are directed to a nonvolatile memory device and a programming method thereof, which substantially overcome one or more of the problems and disadvantages of the related art.

It is a feature of an embodiment to provide a nonvolatile memory device and a programming method thereof having an increased programming speed.

It is another feature of an embodiment to provide a nonvolatile memory device and a programming method thereof having a dynamically increased programming voltage.

It is yet another feature of an embodiment to provide a nonvolatile memory device and a programming method thereof in which verify-reading is selectively conducted.

An aspect of an embodiment includes a programming method of a multi-bit flash memory device, being include programming multi-bit data into selected memory cells through a plurality of programming loops. In each programming loop, the method may include varying an increment of a programming voltage applied to the selected memory cells in accordance with a result of program-verification to each of data states with the multi-bit data and skipping the reading-verification for a data state when the program-verification indicates that data state has passed.

In an embodiment, the data states may include '01', '10', and '00'.

In an embodiment, when the program-verification indicates data state '01' has passed, the method may include increasing the increment of the programming voltage and a next programming loop may be performed without program-verification of the data state '01'.

In an embodiment, when the program-verification indicates data state '10' passes, the method may include increasing the increment of the programming voltage and a next programming loop may be performed without program-verification of the data state '10'.

In an embodiment, when the program-verification indicates '00' passes, the programming may be terminated.

In an embodiment, the program-verification may be performed by a wired-OR pass/fail check.

According to another feature of an embodiment, a programming method of a flash memory device includes (a) programming multi-bit data into selected memory cells, (b) conducting a verify-reading operation for the selected memory cells, and (c) conducting a program-verifying operation for each data state of the multi-bit data in accordance with data bits read by the verify-reading operation. The method may include (d) varying an increment of a programming voltage applied to the selected memory cells in accordance with a result of the program-verifying operation for each data state of the multi-bit data and (e) skipping the verify-reading operation of a data state when the program-verifying operation indicates that data state passes.

In this embodiment, (a), (b), and (c) may be repeated until the selected memory cells are all detected as corresponding to program-pass.

In this embodiment, the data states may include '01', '10', and '00'.

In this embodiment, the verify-reading operation may be performed carried out to the data states '01', '10', and '00'.

In this embodiment, during the verify-reading operation of the data state '01', verify-reading of the data states '10' and '00' may not be performed.

In this embodiment, during the verify-reading operation to the data state '10', verify-reading of the data state '00' may not be performed.

In this embodiment, if the data state '01' passes, the increment of the programming voltage may increase and a subsequent programming loop may be performed without the verify-reading operation to the data state '01'.

In this embodiment, if the data state '10' passes, the increment of the programming voltage may increase and a subsequent programming loop may be performed without the verify-reading operation to the data state '10'.

In this embodiment, if the data state '00' passes, the programming may be terminated.

In this embodiment, the program-verifying operation may be carried out by wired-OR pass/fail check.

Another aspect of an embodiment is a flash memory device including a memory cell array with a plurality of memory cells arranged in rows and columns; a row selector configured to a row of the memory cell array, a page buffer circuit configured to sense data from selected memory cells through the rows, a pass/fail check circuit configured to determine whether the selected memory cells have been successfully programmed, referring to the data sensed by the page buffer circuit, and a control logic circuit configured to control the row selector, the page buffer circuit, and the pass/fail check circuit to correspondingly program multi-bit data into the selected memory cells through plurality of programming loops. In each programming loop, the control logic circuit may be configured to control the row selector, the page buffer circuit, and the pass/fail check circuit to vary an increment of a programming voltage applied to the selected memory cells in accordance with a result of program-verification for each data state of the multi-bit data and to skip the program-verification for a data state when the program-verification indicates that data state has passed.

In an embodiment, the data states may include '01', '10', and '00'.

In an embodiment, if the program-verification indicates the data state '01' passes, the control logic circuit may be configured to control the row selector, the age buffer circuit, and the pass/fail check circuit to increase the increment of the programming voltage and to conduct a subsequent programming loop without the program-verification to the data state '01'.

In an embodiment, if the program-verification indicates the data state '10' passes, the control logic circuit may be configured to control the row selector, the page buffer circuit, and the pass/fail check circuit to increase the increment of the programming voltage and to conduct a subsequent programming loop without the program-verification to the data state '10'.

In an embodiment, if the program-verification indicates the data state '00' passes, the control logic circuit may be configured to control the row selector, the page buffer circuit, and the pass/fail check circuit to stop programming.

An embodiment may also provide a memory card including a flash memory device and a controller configured to control the flash memory device. The flash memory device may be programmed is accordance with any of the above programming methods.

An embodiment may also provide a memory card including a flash memory device and a controller configured to control the flash memory device. The flash memory device may be configured in accordance with any of the above devices.

BRIEF DESCRIPTION OF THE DRAWINGS

The above and other features and advantages will become more apparent to those of ordinary skill in the art by describing in detail exemplary embodiments with reference to the attached drawings, in which:

FIG. 5 illustrates a block diagram of a processor system including a flash memory device operable in the programming method in accordance with an embodiment.

DETAILED DESCRIPTION

Korean Patent Application No. 10-2007-68683, filed on Jul. 9, 2007, in the Korean Intellectual Property Office, and entitled: "Nonvolatile Semiconductor Memory Device and Programming Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
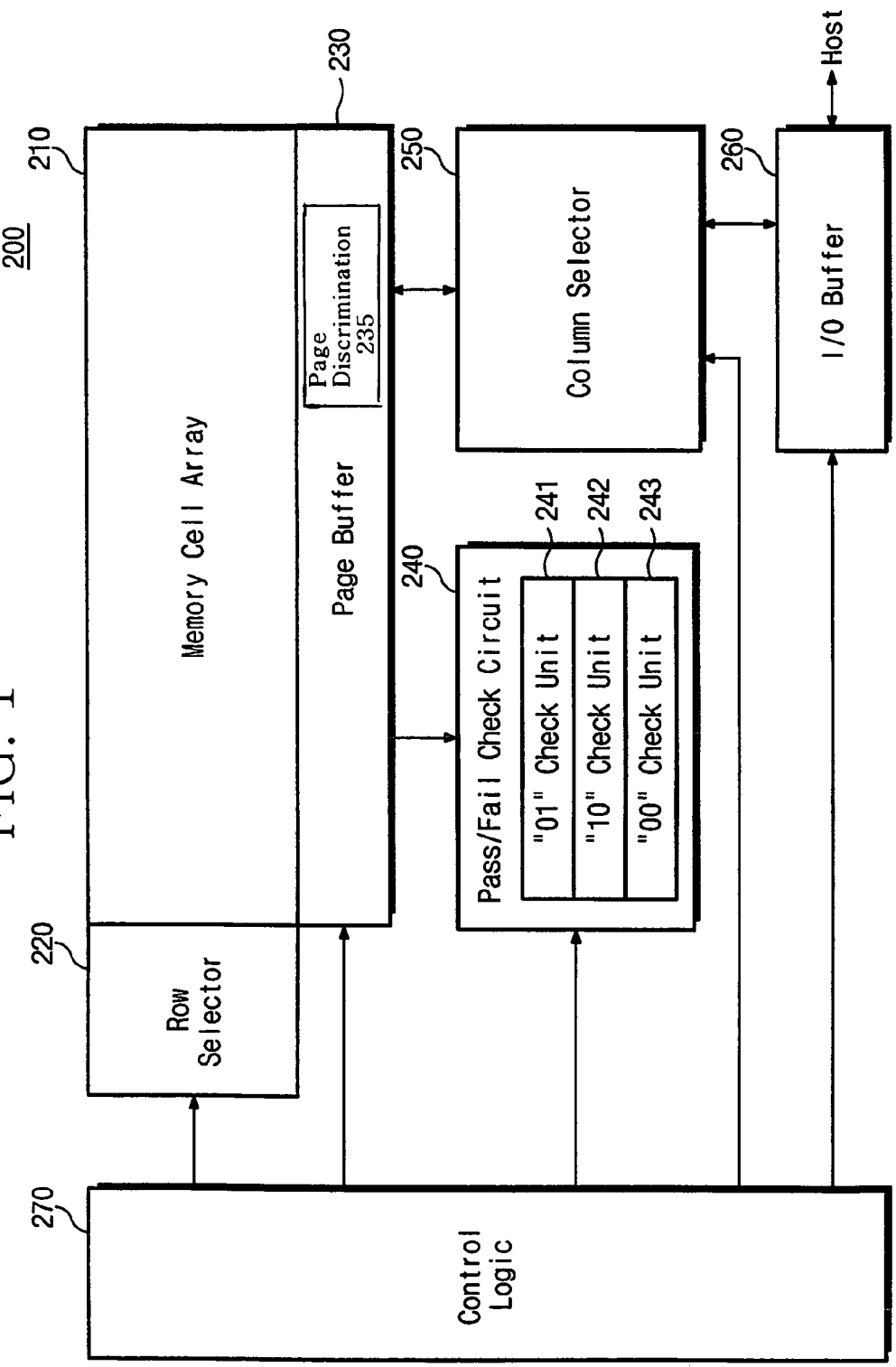
FIG. 1 illustrates a block diagram of a programming scheme in a nonvolatile semiconductor memory device according to an embodiment.

FIG. 1 illustrates a block diagram of a programming scheme in a nonvolatile semiconductor memory device 200 according to an embodiment.

Referring to FIG. 1, the nonvolatile memory device 200 may include a memory cell array 210, a control logic circuit 270, a row selector 220, a column selector 250, a page buffer circuit 230, an input/output (I/O) buffer 260, and a pass/fail check circuit 240.

The memory cell array 210 may include memory cells arranged in a matrix of rows (or word lines) and columns (or bit lines). The memory cells may be arranged in a NOR or NAND logic structure. The NAND structure may be configured in a logical circuit pattern in which pluralities of memory cells are connected to a single bit line in series. The NOR structure may be configured in a logical circuit pattern in which pluralities of memory cells are connected to a single bit line in parallel. In this embodiment, the memory cells are assumed to be arranged in the NAND structure.

The row selector 220 may be controlled by the control logic circuit 270, and may apply word line voltages to selected and deselected rows in response to a row address (not shown). In a programming operation, the row selector 220 may apply a programming voltage to a selected row while applying pass voltages to deselected rows. In a verifying operation, the row selector 220 may apply a verify-reading voltage to a selected row while applying pass voltages to deselected rows.

The column selector 250 may be controlled by the control logic circuit 270, and may designate a specific bit line from the plural bit lines in response to a column address (not shown).

The page buffer circuit 230 may also be controlled by the control logic circuit 270, and may write data into the memory cell array 210 or read (or verify-read) data from the memory cell array 210. In this embodiment, data read out by the verify-read operation may be stored in latches (not shown) included in the page buffer circuit 230.

The page buffer circuit 230 may include a discrimination unit 235 for discriminating data states (e.g., '01', '10', and '00') to be programmed into the memory cells. The discrimination unit 235 may determine data states in the memory cells. Thus, the discrimination unit 235 may conduct a selective verify-reading operation and a pass/fail checking operation (e.g., a wired-OR pass/fail checking operation) in accordance with data states.

As illustrated in FIG. 1, in which the flow indicated by arrows indicates a programming operation, the I/O buffer 260 may transfer data to the column selector 250 from an external unit (e.g., a host). Data provided to the column selector 250 may be loaded into the page buffer circuit 230 by page units. The I/O buffer 260 may transfer data from the page buffer circuit 230 to an external unit through the column selector 250.

The pass/fail check circuit 240 may inspect the memory cells to determine whether the memory cells in the memory cell array 210 have been successfully programmed or not. If data stored in the page buffer circuit 230 all correspond to the program-pass value (e.g., '1'), the pass/fail check circuit 240 may supply the control logic circuit 270 with a signal indicating that the programmed result passed. If data stored in the page buffer circuit 230 fully or partially correspond to the program-fail value (e.g., '0'), the pass/fail check circuit 240 may supply the control logic circuit 270 with a signal indicating that the programmed result failed.

The pass/fail check circuit 240 may include a plurality of check units. For instance, in the case of 2-bit MLCs, the pass/fail check circuit 240 may include three check units 241, 242, and 243 for inspecting the program-passed result from three data states '01', '10', and '00'. In other words, for 2-bit MLCs, the pass/fail check circuit 240 may include the '01' check unit 241, the '10' check unit 242, and the '00' check unit 243.

Each check unit may be configured to inspect whether one of the three data states '01', '10', and '00' is in the program-pass or program-fail condition. For instance, the '01' check unit 241 may execute a pass/fail checking operation for the data state '01'. After the verify-reading operation, the '01' check unit 241 receives signals indicating the program-pass or program-fail of the memory cells storing the data state '01'. The program-pass condition results in success only if all memory cells storing the data state '01' have been successfully programmed. In this case, the '01' check unit 241 may output a signal informing the control logic circuit 270 that the programming operation for the data state '01' has been completed. Similarly, the '10' and '00' check units 242 and 243 may operate as aforementioned. In the same manner, 3-bit MLCs may include seven check units in the pass/fail check circuit 240, and so forth.

The control logic circuit 270 may be configured to control an overall operation of the nonvolatile memory device 200. In this embodiment of the present invention, the control logic circuit 270 may control a series of operations for the programming mode. For instance, the control logic circuit 270 may control the row selector 220 to apply the programming or verifying voltage to a selected word line. The control logic circuit 270 may determine to increase the programming voltage by a voltage increment $\Delta V$ in response to a signal from the pass/fail check circuit 240.

With the aforementioned structure, the programming operation is carried out in the nonvolatile memory device 200. When data is received data from an external unit, the I/O buffer 260 and the column selector 250 may load page data into the page buffer circuit 230. In order to program the loaded data into memory cells coupled to a selected word line, the control logic circuit 270 may enable the row selector to apply different voltages respectively to the selected and deselected word lines.

Afterward, the verify-reading operation may begin. In the verify-reading operation, a verify-reading voltage Vread may be applied to the selected word line while the passing voltage Vpass may be applied to the deselected word lines. Data generated by the verify-reading operation may be stored in latches of the page buffer circuit 230.

After the verify-reading operation, the pass/fail checking operation may begin. The pass/fail checking operation may be carried out by the pass/fail check circuit 240. The pass/fail check circuit 240 may include the check units 241, 242, and 243. Each check unit may determine the program-pass condition for one of the data states '01', '10', and '00'. For example, the '01' check unit 241 may determine the program-pass condition from memory cells storing the data states '01'. A result of pass/fail check of the pass/fail check circuit 240 may be provided to the control logic circuit 270.

The control logic circuit 270 may determine whether to execute the verify-reading operation or to increase the programming voltage by the increment $\Delta V$ in response to a pass/fail check result. For example, if the memory cells storing the data state '01' pass, the control logic circuit 270 may control the row decoder 220 and the page buffer circuit 230 to skip the verify-reading operation to the data state '01'. In response to a program-pass result, the control logic circuit 270 may increase the voltage increment $\Delta V$.

As a result, during the programming operation, a time for programming the memory cells may be decreased by skipping the verify-reading operation or increasing the voltage increment $\Delta V$. Additionally, while this embodiment is shown with 2-bit MLCs, embodiments are applicable to 3-bit MLCs, and so forth. For higher bit MLCs, the number of check units may be increased in the pass/fail check circuit 240.

FIGS. 2(a) and 2(b) illustrate diagrams of procedures of programming the least and most significant bits, i.e., the LSBs and MSBs, into MLCs, respectively.

Referring to FIG. 2(a), page data of LSBs may first be loaded into the page buffer circuit 230. The LSB may be '1' or '0'. If the LSB is '1', the programming operation may maintain threshold voltages of the memory cells. If the LSB is '0', the memory cells may be programmed to increase threshold voltages thereof, as shown by path ① of FIG. 2(a).

Referring to FIG. 2(b), page data of MSBs may first be loaded into the page buffer circuit 230. Voltages V1, V2, and V3 indicated in FIG. 2(b) are program-verifying voltages. After programming the LSBs, programming of the MSBs may begin. Referring to the LSBs and MSBs, it is able to discriminate the data states to be stored in the MLCs. The programming procedure for the MSBs will be described in detail with reference to FIG. 3.

Figure 3:
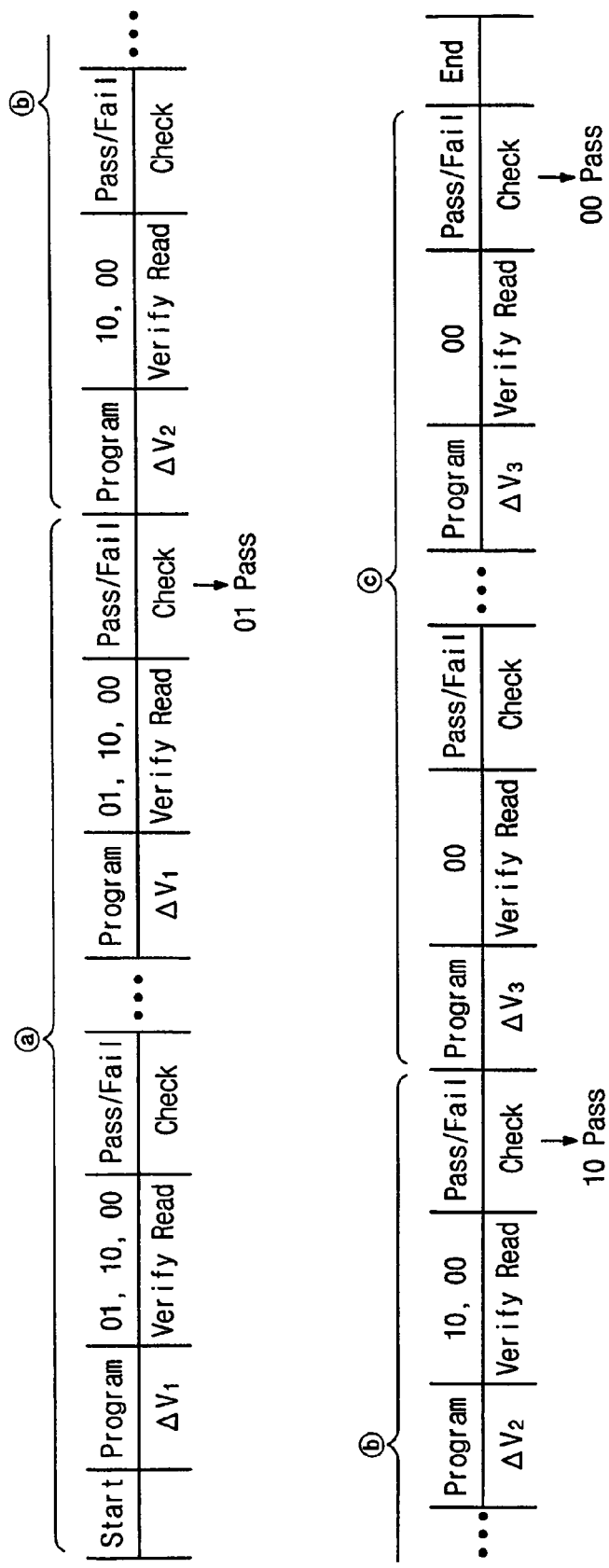
FIG. 3 illustrates a methodological feature of programming the MSBs in the nonvolatile semiconductor memory device according to an embodiment.

FIG. 3 illustrates a methodological feature of programming the MSBs in the nonvolatile semiconductor memory device according to an embodiment.

Referring to FIG. 3, first, the programming voltage may be applied to a selected word line. In this operation, the voltage increment is referred to as $\Delta V1$. The programming voltage Vpgm may increase stepwise by $\Delta V1$ with an increasing number of programming loops.

After applying the programming voltage Vpgm to a selected word line (Program Execution), the verify-reading operation may begin for the memory cells storing the data states '01', '10', and '00' (Verify Read). In the verify-reading operation, the verify-reading voltage may be applied to the selected word line. For example, while executing the verify-reading operation to the data state '01', the verifying voltage V1 is applied to the selected word line. During application of the verifying voltage V1, if the memory cell of the selected word line is turned on, a current flows through its corresponding bit line. Then, a voltage of the bit line may store data '0' in a latch of the page buffer circuit 230. This indicates that the data state '01' has not been yet programmed completely (Program Fail).

If the memory cell of the selected word line is turned off, there is no current through the corresponding bit line. Thus, a voltage of the bit line may be maintained to store data '1' in the latch of the page buffer circuit 230. This indicates that the data state '01' has been completely programmed (Program Pass).

However, in the verify-reading operation for the data state '01', as the verifying voltages are applied to the control gates of all memory cells coupled to the same word line, there may be a problem that the memory cells to store the data states '10' and '00' are considered to be passed although they have not been programmed sufficiently. Thus, in the verify-reading operation for the data state '01', it inhibits to conduct the verify-reading operation for the data states '10' and '00'. This inhibition is accomplished by referring to the discrimination unit 235 of the page buffer circuit 230. In the verify-reading operation for the data state '01', the latch of the page buffer circuit 230, which is connected to a memory cell to store the data state '01', retains the program-fail value.

The verify-reading operations for the data states '10' and '00' may be similarly conducted. In this case, the verifying voltage for the data state '10' is assigned to V2 (>V1) and the verifying voltage for the data state '00' is assigned to V3 (>V2). During the verify-reading operation for a memory cell storing the data state '10', the latch of the page buffer circuit 230, connected to a memory cell to store the data state '00', may retain the program-fail value because it inhibits the verify-reading operation for the data state '00'. As aforementioned, the verify-reading operation may be selectively executed in accordance with the data states '01', '10', and '00'.

After the verify-reading operation, the pass/fail checking operation begins. The pass/fail checking operation may be performed by the pass/fail check circuit 240. The pass/fail check circuit 240 may include pluralities of the check units 241, 242, and 243. Each check unit may determine the program-pass value for one of the data states '01', '10', and '00'. For instance, the '01' check unit 241 may determine the program-pass value from memory cells storing the data states '01'. The '01' check unit 241 may check whether the programmed result is passed, with reference to the latch of the page buffer circuit 230, connected to a memory cell storing the data state '01'. In the same manner, the check units 242 and 243 may operate to determine their program-pass value for the data states '10' and '00', respectively.

From a result of the pass/fail checking operation, if there is a program-fail value, the programming voltage Vpgm is applied again to the selected word line with the increment ΔV1. The programming voltage may increase stepwise until the programming operation results in pass. Otherwise, if the program-pass value is detected from a memory cell storing the data state '01', the voltage increment may be raised (ΔV1→ΔV2). As the voltage increment gradually increases, a threshold voltage of the memory cell reaches a target level rapidly. Thus, a programming time thereof may be decreased.

After the increase of the programming voltage Vpgm, the next step of programming is conducted (the period ⓑ of FIG. 3). After applying the programming voltage Vpgm to a selected word line, the verify-reading operations are executed for the data states '10' and '00'. Since the programmed result for the memory cells storing the data state '01' have been already passed, the verify-reading operation for the memory cells storing the data state '01' will not be carried out. Thus, a programming time thereof may be decreased.

From a result of the pass/fail checking operation, if there is a program-fail value, the programming voltage Vpgm is applied again to the selected word line with the increment ΔV2. Otherwise, if the program-pass value is detected from a memory cell storing the data state '10', the voltage increment is raised (ΔV2→ΔV3). As the voltage increment gradually increases, a threshold voltage of the memory cell reaches a target level rapidly. Thus, a programming time thereof may be decreased.

After increasing the programming voltage Vpgm, the programming may proceed (the period ⓒ of FIG. 3). After applying the programming voltage Vpgm to a selected word line, the verify-reading operation is executed for the data state '00'. Since the programmed results for the memory cells storing the data states '01' and '00' have been already passed, the verify-reading operations for the memory cells storing the data states '01' and '00' will not be carried out. Thus, a programming time thereof may be decreased.

From a result of the pass/fail checking operation, if there is a program-fail value, the programming voltage Vpgm is applied again to the selected word line with the increment ΔV3. Otherwise, if the program-pass value is detected from a memory cell storing the data state '00', the programming procedure is terminated because all of the data states '01', '10', and '00' have been completely programmed.

In summary, during period ⓐ of FIG. 3, the programming voltage Vpgm may increase by ΔV1 when the programming loop is repeated. The programming loop may be repeated until the programmed result for the data state '01' passes.

If the programmed result for the data state '01' passes, the procedure enters into the period ⓑ. In the period ⓑ, the programming voltage increases by ΔV2 along the repetition of the programming loop. The programming loop is repeated until the programmed result for the data state '10' passes.

If the programmed result for the data state '10' passes, the procedure may proceed to period ⓒ. In period ⓒ, the programming voltage increases by ΔV3 along the repetition of the programming loop. The programming loop may be repeated until the programmed result for the data state '00' passes.

If the programmed result for the data state '00' is passed, the procedure of the programming operation is terminated. As such, it is possible to shorten the programming time by raising the programming voltage by ΔV in accordance with the program-pass condition.

Figure 4A:
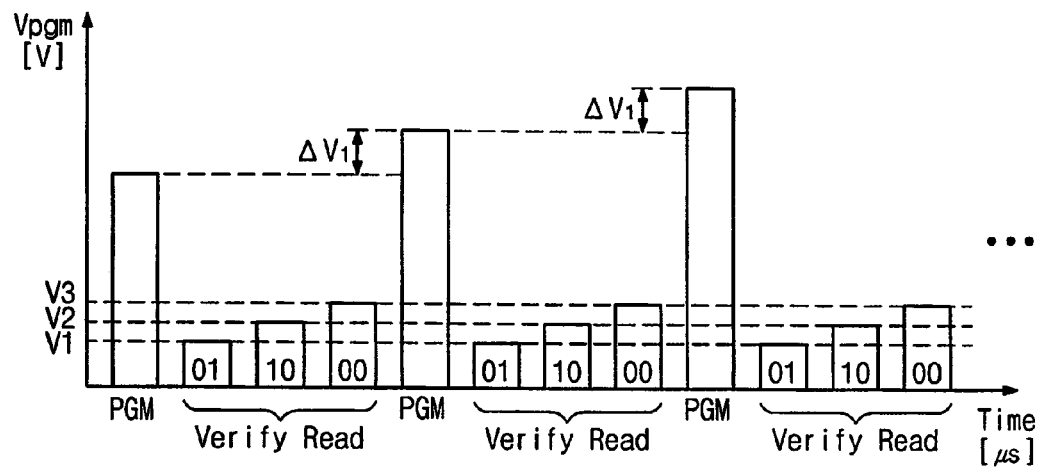
FIGS. 4A, 4B, and 4C illustrate graphic diagrams of levels of program voltages changing along the progress of the programming operation.
Figure 4B:
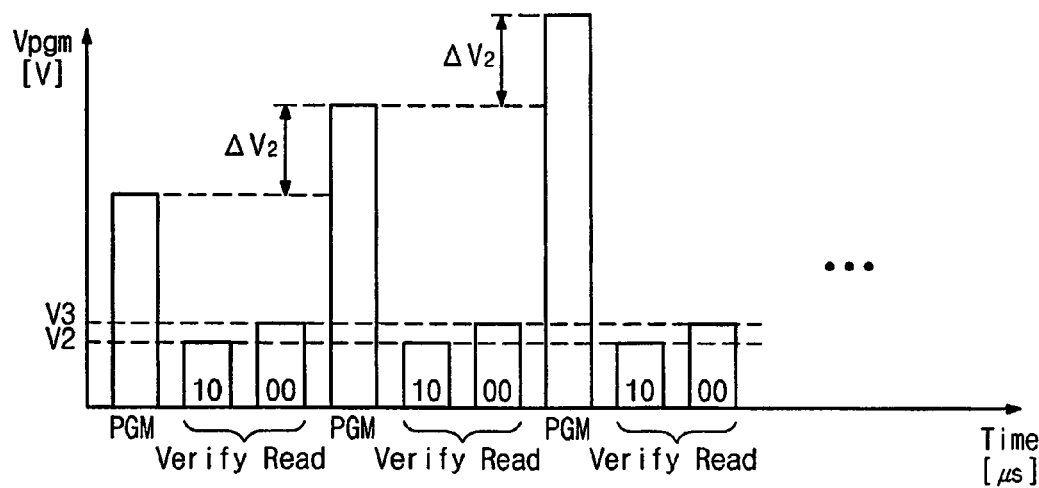
Figure 4C:
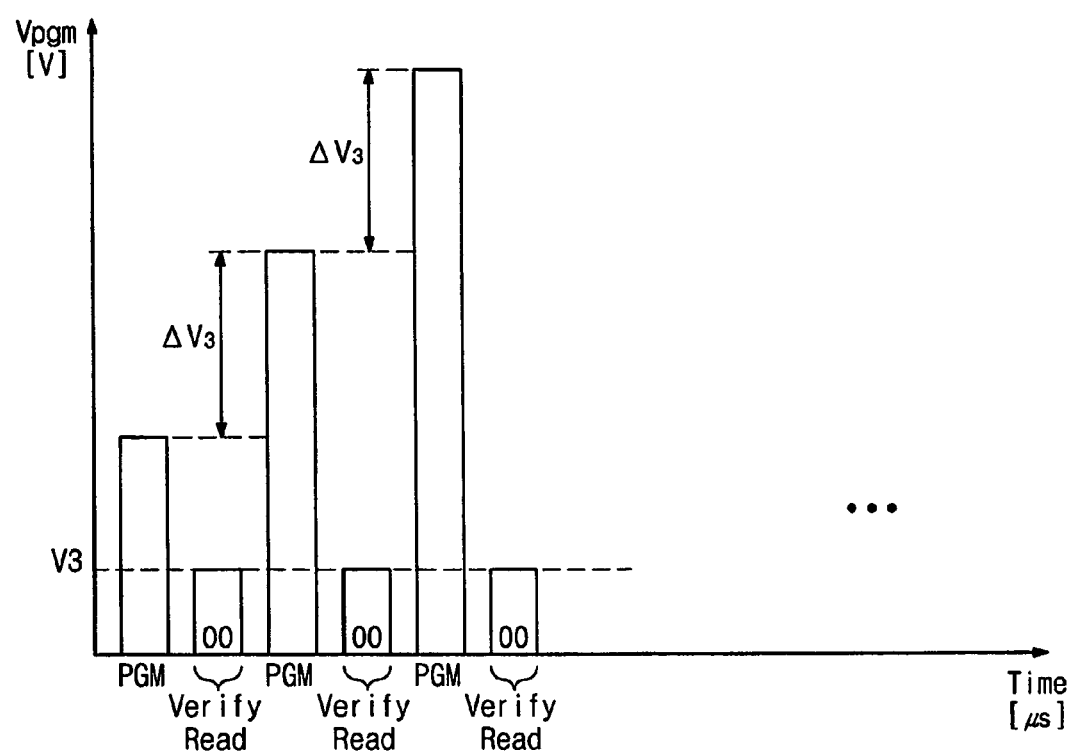

FIGS. 4A, 4B, and 4C illustrate diagrams of levels of program voltages changing along the progress of the programming operation. FIGS. 4A, 4B, and 4C correspond to the periods ⓐ, ⓑ, and ⓒ, respectively. Each programming loop includes the programming and verify-reading periods.

In FIG. 4A, the programming voltage is applied to a selected word line. For the verify-reading operation to the data states '01', '10', and '00', the verifying voltages V1, V2, and V3 are sequentially applied to the selected word line. If a program-fail value is detected, the programming voltage Vpgm with the increment ΔV1 is applied to the selected word line in the next programming loop. In this manner, the programming loop may be repeated until the programmed result for the data state '01' passes.

In FIG. 4B, the programming voltage is applied to the selected word line. For the verify-reading operation to the data states '10' and '00', the verifying voltages V2 and V3 are sequentially applied to the selected word line. If a program-fail value is detected, the programming voltage Vpgm increased by the increment ΔV2 is applied to the selected word line in the next programming loop. ΔV2 is larger than ΔV1. In this manner, the programming loop may be repeated until the programmed result for the data state '10' passes.

By increasing the programming voltage by the increment ΔV, which may increase with later iterations, the threshold voltages of the memory cells may rapidly rise up to the target level, thereby enhancing a programming rate. Further, the verify-reading operation for the data state '01' may be skipped to improve programming speed.

In FIG. 4C, the programming voltage Vpgm is applied to the selected word line. For the verify-reading operation to the data state '00', the verifying voltage V3 is applied to the selected word line. If a program-fail value is detected, the programming voltage Vpgm increased by the increment ΔV3 is applied to the selected word line in the next programming loop. ΔV3 is larger than ΔV2. In this way, the programming loop may be repeated until the programmed result for the data state '00' passes.

According to the increase of the programming voltage by the increment ΔV, the threshold voltages of the memory cells may rapidly rise to the target level, thereby enhancing programming speed. Alternatively or additionally, the verify-reading operations for the data states '01' and '10' may be skipped to improve programming speed.

FIG. 5 illustrates a block diagram of a processor system including a flash memory device operable using the programming method of an embodiment.

Referring to FIG. 5, the processor system 300 may include a processor 310, a controller 320, and a flash memory 350. External input device 330 and external output devices 340 may be in communication with the processor system 300. The solid lines denote data flows and the dashed lines denote control signal flows.

In the processor system 300, data are input through the external input devices (e.g., keyboard, camera, etc.) 330. Input data may be commands by users, multimedia data, e.g., image data taken by cameras, and so forth. Such input data may be stored in the flash memory 350.

The controller 320 may control the components of the processor system 300 in response to commands stored in the flash memory 350. The processor 310 may perform processing operations in response to outputs of the controller 320. Processed results may be stored in the flash memory 350. The output devices 340 may output data from the flash memory 350 in response to outputs of the controller 320. The output devices 340 may provide perceptible patterns for users. For example, the output devices 340 may include one or more of a display, a speaker, and so forth.

Figure 2:
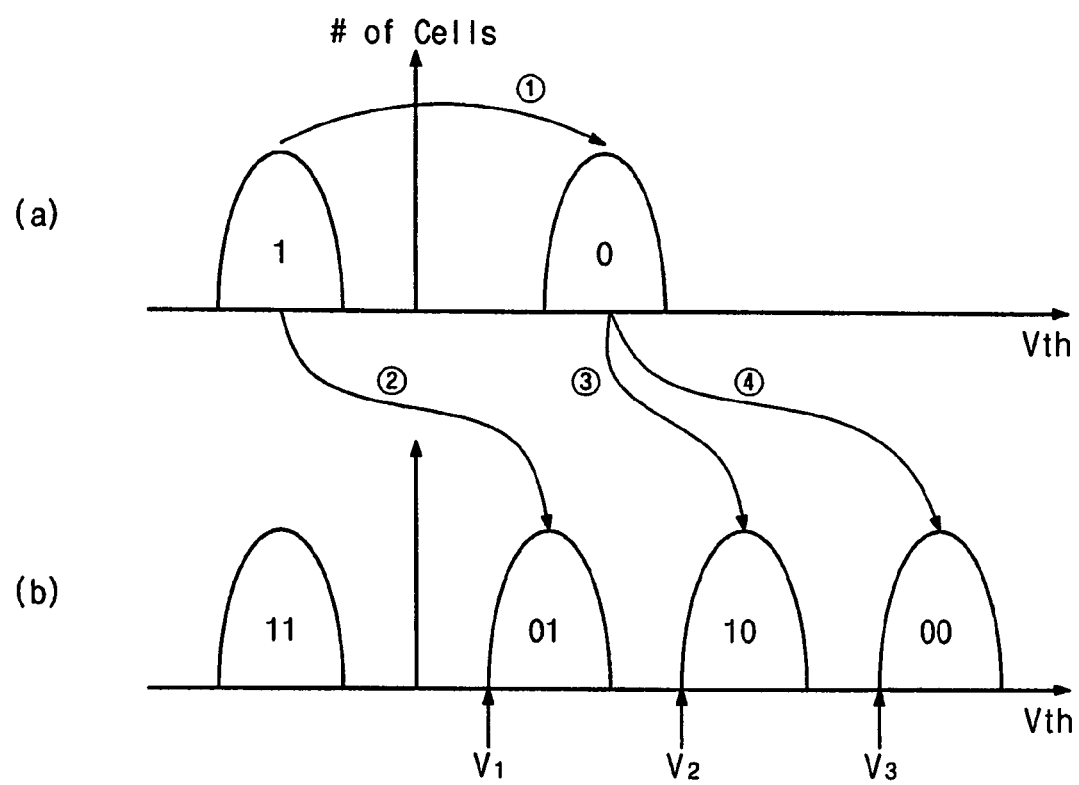
FIGS. 2(a) and 2(b) illustrate diagrams of procedures of programming the least and most significant bits into multi-level cells.

The flash memory 350 may operate in the same manner as the nonvolatile memory device 200 shown in FIG. 2. The flash memory 350 may store N-bit data (N is an integer greater than or equal to 2) which has been processed or will be processed by the processor 310 under control of the controller 320.

The flash memory 350 and/or the controller 320 may be mounted on the processor system 300 by way of various types of packages. For instance, the flash memory 350 and/or the controller 320 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

Although not shown in FIG. 5, it should be understood by those skilled in the art that a power supply unit (not shown) may be provided to the processor system 300. For example, if the processor system 300 is within a mobile apparatus, the power supply unit may include a battery (not shown).

The processor system 300 including the flash memory 350 according to embodiments may have operation performance that is proportional to the improvement of the programming speed of the flash memory 350.

As described above, according to the condition of program-pass or fail of the data states, the verify-reading operation may be selectively conducted to shorten the programming time. Additionally or alternatively, according to the condition of program-pass or fail of the data states, the programming voltage may dynamically increase to shorten the programming time.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A programming method of a multi-bit flash memory device, the method comprising:
    programming multi-bit data into selected memory cells through at least two programming loops,
    wherein, during each programming loop, the method includes
    varying an increment of a programming voltage applied to the selected memory cells in accordance with a result of program-verification of each data state of the multi-bit data, wherein the data states includes '01', '10', and '00', and
    if a result of the program-verification to the data state '00' passes, the programming is terminated;
    skipping reading-verification for a data state if program verification indicates that data state has passed.

2. The method as claimed in claim 1, wherein varying the increment includes, if program-verification indicates the data state '01' passes, increasing the increment of the programming voltage and performing a subsequent programming loop without reading-verification of the data state '01'.

3. The method as claimed in claim 1, wherein varying the increment includes, if program-verification indicates the data state '10' passes, increasing the increment of the programming voltage and performing a subsequent programming loop without reading-verification of the data state '10'.

4. The method as claimed in claim 1, wherein the program-verification is carried out by wired-OR pass/fail check.

5. A memory card, comprising:
    a flash memory device; and
    a controller configured to control the flash memory device,
    wherein the flash memory device is programmed by the programming method claimed in claim 1.

6. A programming method of a flash memory device, the method comprising:
    (a) programming multi-bit data into selected memory cells;
    (b) conducting a verify-reading operation for the selected memory cells;
    (c) conducting a program-verifying operation for each data state of the multi-bit data in accordance with data bits read by the verify-reading operation;
    (d) varying an increment of a programming voltage applied to the selected memory cells in accordance with a result of the program-verifying operation for each data states of the multi-bit data; and
    (e) skipping the verify-reading operation for a data state when the program-verifying operation indicates that data state has program-passed.

7. The method as claimed in claim 6, wherein (a), (b), and (c) are repeated until the program-verifying operation indicates all selected memory cells have program-passed.

8. The method as claimed in claim 6, wherein the data states include '01', '10', and '00'.

9. The method as claimed in claim 8, wherein the verify-reading operation is carried out for each of data states '01', '10', and '00'.

10. The method as claimed in claim 9, wherein, during the verify-reading operation to the data state '01', the verify-reading operations for the data states '10' and '00' are not performed.

11. The method as claimed in claim 9, wherein, during the verify-reading operation to the data state '10', the verify-reading operation of the data state '00' is not performed.

12. A memory card, comprising:
a flash memory device; and
a controller configured to control the flash memory device, wherein the flash memory device is programmed by the programming method claimed in claim 6.

13. A flash memory device, comprising:
a memory cell array having with a plurality of memory cells arranged in rows and columns;
a row selector configured to select a row of the memory cell array;
a page buffer circuit configured to sense data from selected memory cells through the rows;
a pass/fail check circuit configured to determine whether the selected memory cells have been successfully programmed, referring to the data sensed by the page buffer circuit; and
a control logic circuit configured to control the row selector, the page buffer circuit, and the pass/fail check circuit to correspondingly program multi-bit data into the selected memory cells through pluralities of programming loops,
wherein, in each programming loop, the control logic circuit is configured to control the row selector, the page buffer circuit, and the pass/fail check circuit to vary an increment of a programming voltage applied to the selected memory cells in accordance with a result of program-verification for each data state of the multi-bit data, and to skip reading-verification for a data state when the program-verification indicates that data state has passed.

14. The flash memory device as claimed in claim 13, wherein the data states include '01', '10', and '00'.

15. The flash memory device as claimed in claim 14, wherein, when the program-verification indicates the data state '01' has passed, the control logic circuit is configured to control the row selector, the page buffer circuit, and the pass/fail check circuit to increase the increment of the programming voltage and to conduct the next programming loop without reading-verification of the data state '01'.

16. The flash memory device as claimed in claim 14, wherein, when the program-verification indicates the data state '10' has passed, the control logic circuit is configured to control the row selector, the page buffer circuit, and the pass/fail check circuit to raise the increment of the programming voltage and to conduct the next programming loop without reading-verification of the data state '10'.

17. The flash memory device as claimed in claim 14, wherein, when the program-verification indicates the data state '00' has passed, the control logic circuit is configured to control the row selector, the page buffer circuit, and the pass/fail check circuit to stop programming.

18. A memory card, comprising:
a flash memory device; and
a controller configured to control the flash memory device, wherein the flash memory device is configured as claimed in claim 13.

* * * * *